(12) United States Patent
Werthner

(10) Patent No.: US 7,227,357 B2
(45) Date of Patent: Jun. 5, 2007

(54) METHOD FOR POSITIONING A SLICE OF A MAGNETIC RESONANCE MEASUREMENT

(75) Inventor: Harald Werthner, Zirndorf (DE)

(73) Assignee: Siemens Aktiengesellschaft, Munich (DE)

( * ) Notice: Subject to any disclaimer, the term of this patent is extended or adjusted under 35 U.S.C. 154(b) by 9 days.

(21) Appl. No.: 11/169,891

(22) Filed: Jun. 30, 2005

(65) Prior Publication Data

US 2006/0012365 A1 Jan. 19, 2006

(30) Foreign Application Priority Data

Jul. 1, 2004 (DE) ...................... 10 2004 031 983

(51) Int. Cl.
*G01V 3/00* (2006.01)

(52) U.S. Cl. ...................... 324/307; 324/309

(58) Field of Classification Search ................ 324/307, 324/309
See application file for complete search history.

(56) References Cited

U.S. PATENT DOCUMENTS

| 4,791,369 | A | 12/1988 | Yamamoto et al. |
| 5,886,524 | A | 3/1999 | Cole |
| 6,252,401 | B1 | 6/2001 | Werthner et al. |
| 6,882,151 | B2 | 4/2005 | Kiefer et al. |
| 7,088,099 | B2 * | 8/2006 | Doddrell et al. ............ 324/309 |
| 2004/0160221 | A1 | 8/2004 | Kiefer et al. |

FOREIGN PATENT DOCUMENTS

| DE | 195 40 837 A1 | 5/1997 |
| DE | 198 29 850 C2 | 6/2000 |
| DE | 102 50 913 A1 | 5/2004 |
| DE | 102 52 852 A1 | 6/2004 |
| EP | 0 146 873 A2 | 7/1985 |

* cited by examiner

*Primary Examiner*—Louis M. Arana
(74) *Attorney, Agent, or Firm*—Harness, Dickey & Pierce, P.L.C.

(57) ABSTRACT

A method is disclosed for positioning a slice of a magnetic resonance measurement and allowing a graphic determination of the slice to be measured on the basis of a distortion-corrected magnetic resonance image. For this purpose, the coordinates of the slice to be measured are likewise distortion-corrected.

16 Claims, 2 Drawing Sheets

METHOD FOR POSITIONING A SLICE OF A MAGNETIC RESONANCE MEASUREMENT

This Nonprovisional application claims priority under 35 U.S.C. § 119(a) on Patent Application No. 10 2004 031 983.9 filed in Germany on Jul. 1, 2004, the entire contents of which are hereby incorporated herein by reference.

FIELD

The present invention generally relates to a method for positioning a slice of a magnetic resonance measurement.

BACKGROUND

In medical magnetic resonance investigations, it is often first decided on the basis of a general scan which area of a patient is to be imaged. This involves a user graphically determining an area for the next magnetic resonance measurement on the basis of a magnetic resonance image for example. On account of inhomogeneities in the base magnetic field and gradient field of the magnetic resonance device, distortions occur in magnetic resonance images. The distortions are manifested as image defects, which make graphic positioning of the next magnetic resonance measurement more difficult.

Distortions caused by inhomogeneities of the magnetic fields can be reduced or eliminated by suitable methods of correction. However, the positioning of a slice of the subsequent magnetic resonance measurement is not possible on such distortion-corrected images. The slice planned on the basis of the distortion-corrected images generally deviates from the actually measured slice because of the magnetic field inhomogeneities, for which reason the desired slice would not be measured in this case.

In specific situations, this can constitute a risk for the patient, for example in the case of a biopsy. If a biopsy needle is positioned on the basis of a magnetic resonance image on which the desired slice is not depicted, this may result in the removal of an incorrect tissue sample or in injury to the patient. For this reason, so far distortion-corrected magnetic resonance images have not been used for slice positioning and positioning has been carried out on the basis of the uncorrected images.

U.S. reference 2004/0160221 A1 describes a method for exciting planar slices in a magnetic resonance device by taking into consideration non-linear gradient fields. In the process, at least one magnetic resonance overview image is initially created, which is followed by a correction of the overview image on the basis of stored data with respect to non-linear deviations of the gradient fields.

For a planar slice, selected by a user in the corrected overview image, a deviation that occurs in the selected slice is determined on the basis of the stored data. A magnetic resonance sequence with high-frequency excitation pulse, as well as gradient pulses, is computed in such a way that with a simultaneous irradiation of these pulses, the slice to be recorded experiences a curvature during the recording, which is inverse to the non-linear deviations of the overview image. A planar slice is then recorded corresponding to the computed magnetic resonance (MR) sequence.

SUMMARY

It is therefore the object of an embodiment of the present invention to specify an alternative method by which a slice can be positioned on distortion-corrected images.

The object may be achieved by a method in an embodiment. In this case, firstly a position of the slice to be measured is determined on the basis of the distortion-corrected magnetic resonance image. This may be, for example, a general scan. The measuring position resulting from the determination is corrected to compensate for a deviation from the position determined.

The measured slices are also curved corresponding to the inhomogeneity or non-linearity. However, the slice may be correctly positioned. For this, the position of the slice center is corrected corresponding to the distortions. The layer curvature typically reaches significantly high dimensions only in the edge regions so that the actually relevant image region is generally not affected disadvantageously.

This ensures that the slice actually measured coincides with the desired slice. This may reduce or even eliminate not only direct risks to the patient during the investigation, but also risks caused by possible misdiagnoses on the basis of erroneous magnetic resonance measurements.

A particularly advantageously performed method of at least one embodiment will make allowance in the correction, in particular for inhomogeneities of the gradient field of the magnetic resonance device.

BRIEF DESCRIPTION OF THE DRAWINGS

Further advantages and ways of performing the method are explained below in connection with an example embodiment on the basis of the accompanying figures, in which.

DETAILED DESCRIPTION OF THE EXAMPLE EMBODIMENTS

In magnetic resonance investigations, various locations of the measurement are picked up in a frequency-coded manner via a gradient field superposed on the base magnetic field. This allows magnetic resonance signals recorded in the measurement to be allocated via their frequency to a location specified by the gradient profile.

In an ideal case, the frequency would vary linearly with the location by way of a linear gradient profile. However, the relationship between the frequency and the location is generally not linear as a result of inhomogeneities of the base magnetic field and the gradient field. The resulting deviations lead to distortions in the measured images, since without suitable methods of correction a linear gradient profile is used as a basis and the measured magnetic resonance signals are consequently allocated to incorrect locations. With knowledge of the deviations of the actual gradient profile from the ideal gradient profile, such distortions can be reduced or even corrected.

The positioning method explained below is performed on a known diagnostic magnetic resonance device for which the deviations from the ideal gradient profile are known.

Figure 1:
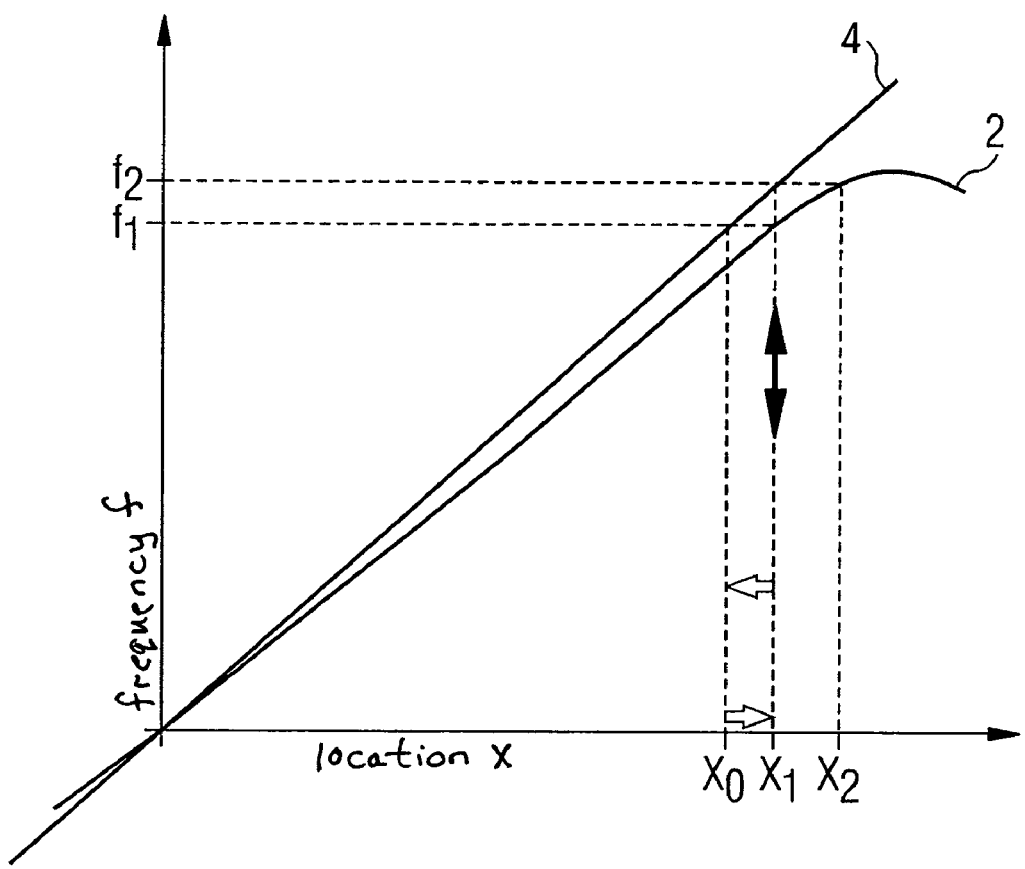
FIG. 1 shows a frequency-location diagram with an ideal gradient profile and an actual gradient profile and FIG. 2 shows a schematic representation of an anatomy of a patient and FIGS. 3 to 6 show magnetic resonance images measured on it.

According to the actual gradient profile 2 in FIG. 1, the location $x_1$ appears with the frequency $f_1$ on account of the inhomogeneities. If no allowance were made for a distortion by the magnetic field in the image representation, the location $x_0$ would be assigned by assuming the ideal gradient profile 4. Allowance is made for this by the distortion correction, and the correct location $x_1$ is assigned.

If a measurement is then desired at the position $x_1$, the frequency $f_2$ would then be assigned to the location $x_1$ without allowance for the magnetic field inhomogeneities. In the measurement which follows, the incorrect location $x_2$ would be picked up according to the actual gradient profile 2. By making allowance for the inhomogeneities by calculating in the selection of the location $x_1$ a point $x_0$ which, without allowance for the inhomogeneities, has the frequency $f_1$, the correct location $x_1$ is also picked up in the measurement. These ways of performing the method are given by way of example on the gradient field for the x-direction and can be analogously transferred to the other spatial directions.

Figure 3:
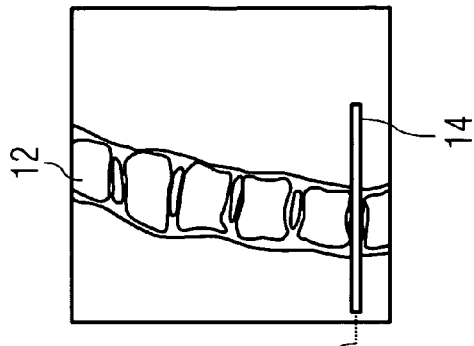
Figure 6:
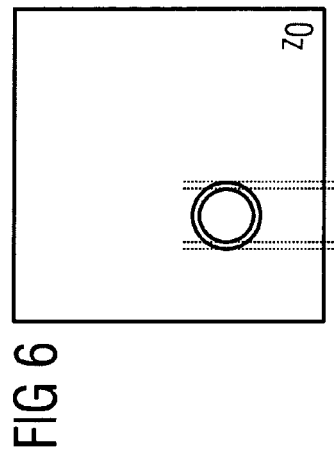
Figure 2:
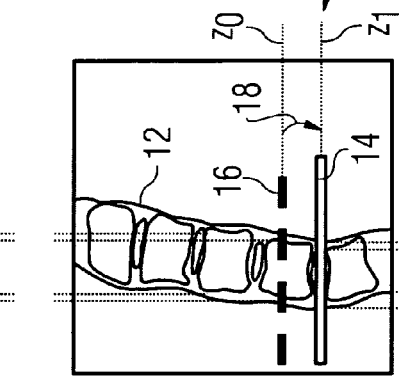

FIGS. 3 to 6 are arranged around FIG. 2 for better representation of how they relate. In FIG. 2, an actual anatomy 12 of a patient is schematically represented. FIG. 3 shows a non-distortion-corrected magnetic resonance image of the anatomy 12 in FIG. 2, which as a result of the distortion is depicted slightly offset downward.

Figure 4:
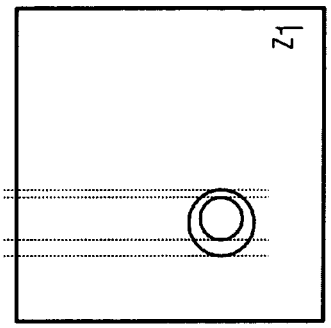
Figure 5:
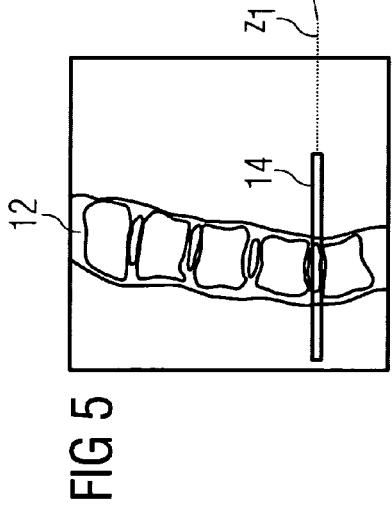

If, on the basis of this image, an orthogonal slice 14 is selected at the position $z_1$, the user obtains the measurement result represented in FIG. 4, which was measured at the desired position $z_1$. FIG. 5 shows a distortion-corrected magnetic resonance image of the anatomy 12, in which the latter is correctly represented. If the slice 14 is positioned on the basis of this distortion-corrected image, the user obtains the result represented in FIG. 6, which however does not correspond to the desired slice 14 at the position $z_1$, since no allowance was made for the distortion in the determination of the desired coordinates of the slice 14. Consequently, the incorrect slice 16 was measured at the position $z_0$.

However, a positioning on the distortion-corrected image in FIG. 5 is possible by an embodiment of the stated method, since the corresponding coordinates of the planned slice are subsequently corrected and the distortion, i.e. the incorrect slice selection, is corrected. This is symbolically represented by the arrow 18 in FIG. 2. The distortion correction 18 has the effect that the user obtains the magnetic resonance image represented in FIG. 4.

To compensate for the distortion of the slice to be measured, the correction of its coordinates is necessary:

$(x_M, y_M, z_M) = (x_F, y_F, z_F) + (\Delta x, \Delta y, 0)$, where the coordinates with the index F, $x_F$, $y_F$ and $z_F$, designate the coordinates determined on the basis of the image and the coordinates with the index M designate the corrected coordinates, obtained by addition of the F coordinates and the differential coordinates $\Delta x$ and $\Delta y$. In the example described here, positioning is based on a two-dimensional image, for which reason the z coordinate is not corrected. Therefore: $z_M = z_F$.

In the following, $\text{col} = (\text{col}_x, \text{col}_y, \text{col}_z)$ and $\text{row} = (\text{row}_x, \text{row}_y, \text{row}_z)$ designate the unit vectors in the direction of the columns and rows of the two-dimensional magnetic resonance image, on the basis of which the position of the slice to be measured is determined. As an index, col and row designate the proportion of the respective value in the corresponding direction.

The differential coordinates within the image plane are determined by way of the following calculation formulae:

$\Delta x = \Delta B_{row}/(G d_{col})$ $\Delta y = \Delta B_{col}/(G d_{row})$ $d_{col}$ and $d_{row}$ indicate the spacing between the pixels of the columns or rows of the magnetic resonance image, which typically lie in the range from 0.1 to 10 mm. The calculation of the differential coordinates is normalized to the pixel spacing by $d_{col}$ and $d_{row}$. G designates the set field gradient in T/m. The inhomogeneous element of the gradient field $\Delta B_{col,row}$ is expanded in spherical coordinates (r, $\theta$, $\phi$) by way of a series of assigned Legendre polynomials $P_{l,m}$, where l and m are whole numbers.

Since the magnetic resonance image is generally not orthogonal to the gradient axes, the inhomogeneities of the three gradients $G_x$, $G_y$ and $G_z$ contribute to the distortion in the directions of row and col and must be allowed for in the expansion. This takes place by projection of corresponding expansion coefficients $A_{l,m \neq 0}$, $B_{l,m \neq 0}$ and $A_{l,m=0}$ for the gradient in the x, y and z directions to the unit vectors row and col, respectively.

By way of the expansion coefficients, which describe deviations from the ideal profile, and the assigned Legendre polynomials, the inhomogeneous field elements are obtained according to:

$$\Delta B_{row} = \sum_{l,m} N_{l,m} \left(\frac{r}{r_0}\right)^l P_{l,m}(\cos \vartheta)[A_{l,m \neq 0} row_x \cos(m\varphi) + B_{l,m} row_y \sin(m\varphi) + A_{l,m=0} row_z],$$

$$\Delta B_{col} = \sum_{l,m} N_{l,m} \left(\frac{r}{r_0}\right)^l P_{l,m}(\cos \vartheta)[A_{l,m \neq 0} col_x \cos(m\varphi) + B_{l,m} col_y \sin(m\varphi) + A_{l,m=0} col_z],$$

where the following applies for the normalizing factors:

$$N_{l,m \neq 0} = (-1)^m \sqrt{\frac{(2l+1) \cdot (l-m)!}{2(l+m)!}} \quad \text{and} \quad N_{l,m=0} = 1.$$

The rows in each case do not include the term l=m=1, since this describes the ideal gradient and only the deviation from it is relevant here.

The coefficients are determined on a reference radius $r_0$ by simulation or measurement. Typically, $r_0 = 0.25$ m is chosen, whereby the simulation can be compared with measurements on a measuring sphere of the same size. With the formulae described, the inhomogeneities of the gradient field can be determined and the position of the slice to be measured can be correspondingly corrected.

The present invention being thus described, it will be obvious that the same may be varied in many ways. Such variations are not to be regarded as a departure from the spirit and scope of the present invention, and all such modifications are intended to be included within the scope of the present invention.

What is claimed is:

1. A method for positioning a slice of a magnetic resonance measurement in a magnetic resonance device with at least one of an inhomogeneous base magnetic field and a non-linear gradient field, the method comprising:
   determining a position of the slice on the basis of a distortion-corrected magnetic resonance image; and
   correcting a resultant measuring position of the slice to compensate for a deviation of the measuring position from the position determined.

2. The method as claimed in claim 1, wherein the correction makes allowance for an inhomogeneity of the base magnetic field.

3. The method as claimed in claim 1, wherein the correction makes allowance for a non-linearity of the gradient field.

4. The method as claimed in claim 1, wherein the position of a slice orthogonal to the magnetic resonance image is determined.

5. The method as claimed in claim 1, wherein the correction of a coordinate $x_F$ of the position determined to compensate for the deviation is determined according to the formula $\Delta x = \Delta B/G$, where $\Delta B$ indicates at least one of the inhomogeneities of the base magnetic field and the deviation of the gradient field from a desired gradient G and the measuring position $x_M$ is calculated according to $x_M = x_F + \Delta x$.

6. The method as claimed in claim 5, wherein a series expansion with assigned Legendre polynomials is used for the determination of $\Delta B$.

7. The method as claimed in claim 2, wherein the correction makes allowance for a non-linearity of the gradient field.

8. The method as claimed in claim 2, wherein the position of a slice orthogonal to the magnetic resonance image is determined.

9. The method as claimed in claim 3, wherein the position of a slice orthogonal to the magnetic resonance image is determined.

10. The method as claimed in claim 7, wherein the position of a slice orthogonal to the magnetic resonance image is determined.

11. The method as claimed in claim 2, wherein the correction of a coordinate $x_F$ of the position determined to compensate for the deviation is determined according to the formula $\Delta x = \Delta B/G$, where $\Delta B$ indicates at least one of the inhomogeneities of the base magnetic field and the deviation of the gradient field from a desired gradient G and the measuring position $x_M$ is calculated according to $x_M = x_F + \Delta x$.

12. The method as claimed in claim 3, wherein the correction of a coordinate $x_F$ of the position determined to compensate for the deviation is determined according to the formula $\Delta x = \Delta B/G$, where $\Delta B$ indicates at least one of the inhomogeneities of the base magnetic field and the deviation of the gradient field from a desired gradient G and the measuring position $x_M$ is calculated according to $x_M = x_F + \Delta x$.

13. The method as claimed in claim 4, wherein the correction of a coordinate $x_F$ of the position determined to compensate for the deviation is determined according to the formula $\Delta x = \Delta B/G$, where $\Delta B$ indicates at least one of the inhomogeneities of the base magnetic field and the deviation of the gradient field from a desired gradient G and the measuring position $x_M$ is calculated according to $x_M = x_F + \Delta x$.

14. A method for positioning a slice of a magnetic resonance measurement at least one of an inhomogeneous base magnetic field and a non-linear gradient field, the method comprising:
    distortion correcting coordinates of a slice to be measured, to thereby allow a graphic determination of the slice to be measured on the basis of a distortion-corrected magnetic resonance image.

15. The method as claimed in claim 14, wherein the correction makes allowance for an inhomogeneity of the base magnetic field.

16. The method as claimed in claim 14, wherein the correction makes allowance for a non-linearity of the gradient field.

* * * * *